(12) United States Patent
Park et al.

(10) Patent No.: US 8,878,251 B2
(45) Date of Patent: Nov. 4, 2014

(54) SILICON-COMPATIBLE COMPOUND JUNCTIONLESS FIELD EFFECT TRANSISTOR

(71) Applicants: Seoul National University R&DB Foundation, Seoul (KR); Kyungpook National University Industry-academic Cooperation Foundation, Daegu (KR); The Board of Trustees of the Leland Stanford Junior University, Palo Alto, CA (US)

(72) Inventors: Byung-Gook Park, Seoul (KR); Seongjae Cho, Seoul (KR); In Man Kang, Daegu (KR)

(73) Assignees: Seoul National University R&DB Foundation, Seoul (KR); Kyungpook National University Industry-academic Cooperation Foundation, Daegu (KR); The Board of Trustees of the Leland Stanford Junior University, Palo Alto, CA (US)

( * ) Notice: Subject to any disclaimer, the term of this patent is extended or adjusted under 35 U.S.C. 154(b) by 79 days.

(21) Appl. No.: 13/653,523

(22) Filed: Oct. 17, 2012

(65) Prior Publication Data
US 2014/0131769 A1 May 15, 2014

(51) Int. Cl.
*H01L 29/66* (2006.01)
*H01L 29/786* (2006.01)
*H01L 29/267* (2006.01)

(52) U.S. Cl.
CPC ........ *H01L 29/78609* (2013.01); *H01L 29/267* (2013.01)
USPC ........... 257/200; 257/190; 257/191; 257/194; 257/279

(58) Field of Classification Search
CPC ..... H01L 29/78; H01L 29/165; H01L 29/205; H01L 29/267; H01L 29/7848; H01L 29/66439
USPC .................. 257/190, 191, 192, 194, 200, 279
See application file for complete search history.

(56) References Cited

U.S. PATENT DOCUMENTS 7,964,482 B2 * 6/2011 Lieten et al. .................. 438/503
8,026,521 B1 9/2011 Or-Bach et al.
(Continued)

FOREIGN PATENT DOCUMENTS

WO 2009/110207 9/2009

OTHER PUBLICATIONS

Seongjae Cho et al.—Silicon-Compatible Bulk-Type Compound Junctionless Field-Effect Transistor—ISDRS 2011, Dec. 7-9, 2011, College Park, MD, USA.

*Primary Examiner* — Matthew W Such
*Assistant Examiner* — Stephen C Smith
(74) *Attorney, Agent, or Firm* — Gerald E. Hespos; Michael J. Porco; Matthew T. Hespos (57) ABSTRACT

The present invention provides a silicon-compatible compound junctionless field effect transistor enabled to be compatible to a bulk silicon substrate for substituting an expensive SOI substrate, to form a blocking semiconductor layer between a silicon substrate and an active layer by a semiconductor material having a specific difference of energy bandgap from that of the active layer to substitute a prior buried oxide for blocking a leakage current at an off-operation time and to form the active layer by a semiconductor layer having electron or hole mobility higher than that of silicon, and to operate perfectly as a junctionless device though the dopant concentration of the active layer is much lower than the prior junctionless device.

20 Claims, 3 Drawing Sheets

(56) References Cited

U.S. PATENT DOCUMENTS

| | | | |
|---|---|---|---|
| 8,487,378 B2* | 7/2013 | Goto et al. | 257/347 |
| 8,507,948 B2* | 8/2013 | Cappellani et al. | 257/192 |
| 2004/0012037 A1* | 1/2004 | Venkatesan et al. | 257/200 |
| 2005/0151164 A1* | 7/2005 | Leitz et al. | 257/192 |
| 2008/0087940 A1* | 4/2008 | Chae et al. | 257/324 |
| 2010/0213512 A1* | 8/2010 | Ko | 257/194 |
| 2010/0276662 A1 | 11/2010 | Colinge | |
| 2012/0068226 A1* | 3/2012 | Hydrick et al. | 257/190 |
| 2012/0228672 A1* | 9/2012 | Daval et al. | 257/192 |
| 2013/0075817 A1* | 3/2013 | Cheng et al. | 257/347 |

* cited by examiner

SILICON-COMPATIBLE COMPOUND JUNCTIONLESS FIELD EFFECT TRANSISTOR

BACKGROUND OF THE INVENTION

1. Field of the Invention

The present invention relates to semiconductor devices, and more particularly to compound junctionless field effect transistors compatibly formed on a silicon substrate as compound semiconductor devices.

2. Description of the Related Art

Figure 1:
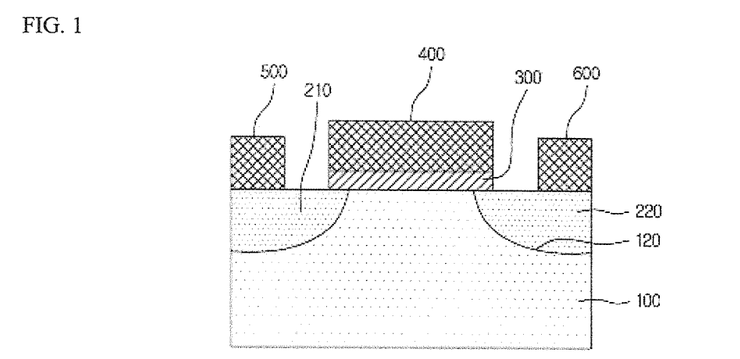
FIG. 1 is a cross-sectional view of a prior junction field effect transistor showing a junction structure according to the formation of source and drain regions.

A conventional field effect transistor, as shown in FIG. 1, is a MOSFET having a MOS structure as a Metal (gate electrode)-Oxide (gate dielectric layer)-Silicon (channel region) structure, consisting of source 210 and drain 220 regions formed by implanting with a dopant of a second conductive type (e.g., n-type) in a silicon substrate of a first conductive type (e.g., p-type) and a gate electrode 400 being separated by a gate dielectric layer 300 and located over a channel region between the source and drain regions.

In the conventional field effect transistor mentioned above, junctions 120 can be come into being due to the source 210 and drain 220 regions formed by a dopant implantation and the junctions form a depletion region (not shown) by pn junctions.

By the being of the depletion regions, a voltage applied to the source and drain electrodes 500 and 600 can generate a current only flowing through a channel formed below the gate electrode 400. Namely, there is an effect being insulated by the depletion regions between the source region 210 and the other part of the silicon substrate 100 as a body region and between the drain region 220 and the body region.

However, there are some problems by the being of the depletion regions. It is a problem that a leakage current is induced in the depletion region formed on the side of the drain region by an impact ionization due to the collision of hot carriers or by the generation of electron-hole pairs due to the tunneling occurred in the overlapping part of the gate electrode and the drain region by a voltage difference between the gate electrode and the drain electrode. Also, it is another problem that the operation of a high frequency such as a cut-off frequency or a power transmission maximum frequency and the like is restricted by the being of the depletion region.

To solve the problems of the conventional MOSFET structure, U.S. Pat. No. 8,026,521B1 and U.S. Patent Publication No. 2010/0276662A1 disclose field effect transistors having a junctionless structure without forming the source/drain regions.

Figure 2:
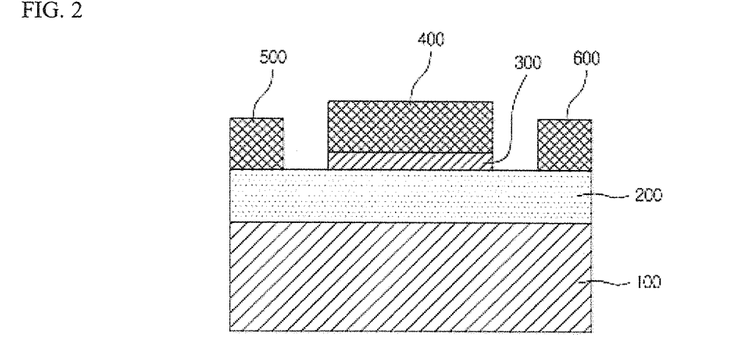
FIG. 2 is a cross-sectional view showing a structure of a prior junctionless field effect transistor fabricated on an SOI substrate.

However, the junctionless field effect transistors developed so far, as shown in FIG. 2, are consisted of a buried oxide (BOX) 100 disposed on the base for blocking the leakage current, an active region of a thin silicon layer 200 doped with doping concentration higher than $1 \times 10^{19}/cm^3$ for a device operation and a structure of source and drain electrodes 500 and 600 contacted directly on the silicon layer 200 in both ends of a gate electrode 400 without additional formation of the source/drain regions.

Therefore, the junctionless field effect transistors developed so far have big problems on the two points as follows:

First, fabrication costs for the prior junctionless field effect transistors are expensive. Since the prior junctionless field effect transistors need a BOX 100 and a thin silicon layer 200 on the BOX 100 for getting the full control ability of a gate, it must use an SOI (silicon-on-insulator) substrate 10 times or higher than the cost of a bulk silicon substrate.

Second, the low power operation of the prior junctionless field effect transistors is difficult. Since the prior junctionless field effect transistors need an SOI substrate having a silicon layer 200 doped with doping concentration higher than $1 \times 10^{19}/cm^3$, the high doping level reduces electron mobility remarkably and has difficulty in providing an driving current with a needed level. For a specific high level of the driving current, it must be needed to apply a high driving voltage.

SUMMARY OF THE INVENTION

To overcome the problems of the prior junctionless field effect transistors, the objective of this present invention is to disclose a compound junctionless field effect transistor enabled to be compatible with a bulk silicon substrate for substituting an expensive SOI substrate, to form a blocking semiconductor layer between silicon substrate and active layer by a semiconductor material having a specific difference of energy bandgap from that of the active layer to substitute a buried oxide for blocking a leakage current at the off-operation time, and to form the active layer by a semiconductor layer having electron or hole mobility higher than that of silicon to operate perfectly though the doping concentration of the active layer is much lower.

To achieve the objective of the present invention, a compound junctionless field effect transistor according to the present invention has the first exemplary mode comprising: a bulk silicon substrate; a blocking semiconductor layer formed of a first semiconductor material having a lattice constant difference with silicon 5% or less and doped to have a first conductive type on the silicon substrate; an active layer formed of a second semiconductor material having a lattice constant difference with the first semiconductor material 2% or less, an electron affinity difference with the first semiconductor material 0.1 eV or less, an energy bandgap 0.5 eV larger than that of the first semiconductor material and doped to have a second conductive type opposite to the first conductive type on the blocking semiconductor layer; a gate electrode formed to be separated by a gate dielectric layer on the active layer; and source and drain electrodes formed to contact electrically to the active layer with having a specific interval from each other and being separated by the gate electrode.

Here, the second semiconductor material is preferable to have electron or hole mobility higher than that of the silicon.

And, the active layer has not only a planar structure, but also a structure projected to have one sidewall at least on the blocking semiconductor layer, and the gate dielectric layer and the gate electrode are formed on the sidewall to have various vertical channel structures.

For detailed example, the active layer is projected to have a cylindrical column shaped sidewall on the blocking semiconductor layer, and the gate dielectric layer and the gate electrode are formed to wrap the cylindrical column shaped sidewall.

And, the active layer is preferable to be doped with doping concentration to have majority carriers of the second semiconductor material be nearly in degenerate states but, at the same time, to make an energy band be slightly sloped at an operation time, and the blocking semiconductor layer is doped with doping concentration to have majority carriers of the first semiconductor material be in non-degenerate states.

For detailed example, the active layer is doped with an n-type dopant to have Fermi level be formed within 3 kT over the minimum value of conduction band of the second semiconductor material at an absolute temperature T, and the blocking semiconductor layer is doped with a p-type dopant to have Fermi level be formed at 3 kT or higher energies over the maximum value of valance band of the first semiconductor material at an absolute temperature T.

For more detailed conditions, the active layer is preferably doped to have the second conductive type be an n-type and to have the doping concentration of the n-type dopant be $9 \times 10^{16} \sim 1 \times 10^{18}/cm^3$, and the blocking semiconductor layer is preferably doped to have the first conductive type be a p-type and to have the doping concentration of the p-type dopant be $3.4 \times 10^{17}/cm^3$ or lower.

Also, the first semiconductor material can be germanium (Ge) or silicon germanium (Si1−xGex) and the second semiconductor material can be gallium arsenide (GaAs). Since gallium arsenide (GaAs) is a representative compound semiconductor having electron mobility higher than that of the silicon, it is preferable as the second semiconductor material. Since the germanium (Ge) and gallium arsenide (GaAs) has little lattice mismatch, a thin gallium arsenide (GaAs) layer can be easily formed on a germanium (Ge) layer. Thus, the objective of this present invention can be achieved for detailed example by forming a lattice constant buffer layer consisted of germanium (Ge) or silicon germanium ($Si_{1-x}Ge_x$) on a silicon substrate.

The present invention enables to block a leakage current by forming a blocking semiconductor layer and an active layer by different semiconductor materials having a different conductive type and a specific energy bandgap difference on a bulk silicon substrate instead of a prior buried oxide of an SOI substrate and enables to have excellent direct-current (DC) and high-frequency properties and a low power operation by the active layer having electron or hole mobility higher than that of the silicon.

BRIEF DESCRIPTION OF THE DRAWINGS

In these drawings, the following reference numbers are used throughout: reference number 10 indicates a silicon substrate, 20 a blocking semiconductor layer, 30 and 32 an active layer, 40, 42 and 44 a gate dielectric layer, 50, 52 and 54 a gate electrode, 60, 62 and 64 a source electrode, and 70 and 72 a drain electrode.

DETAILED DESCRIPTION OF THE PREFERRED EMBODIMENTS

Detailed descriptions of preferred embodiments of the present invention are provided below with respect to accompanying drawings.

A compound junctionless field effect transistor according to the present invention has the technical idea as follows: as commonly shown in FIGS. 3 and 4, though using a bulk silicon substrate 10 much cheaper than an SOI substrate, the present invention enables to block leakage currents caused from the other paths except the source and drain electrodes by forming hetero-semiconductors 20 and 30 having different physical properties such as energy bandgap and the like on the bulk silicon substrate 10 to have energy barrier between the hetero-semiconductors 20 and 30 and simultaneously enables to make the operation of a junctionless device even though an active layer 30 being doped with lower doping concentration than that of the prior pure silicon device.

In the present description, the term "junctionless" means the absence of junctions 120 caused by forming source 210 and drain 220 regions having a different conductive type from a silicon substrate 10 in the structure of the prior filed effect transistor as shown in FIG. 1, and the term "junctionless device" means, as shown in FIGS. 2 and 34, a device structure having source/drain electrodes 60, 70, 500 and 600 connected electrically directly to an active layer 30 or 200 doped with the same conductive type without additional source/drain regions.

Figure 3:
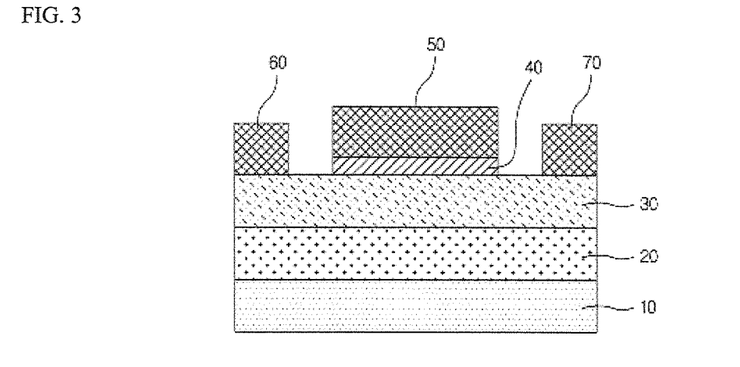
FIG. 3 is a cross-sectional view showing a structure of a compound junctionless field effect transistor according to one embodiment of the present invention.
Figure 4:
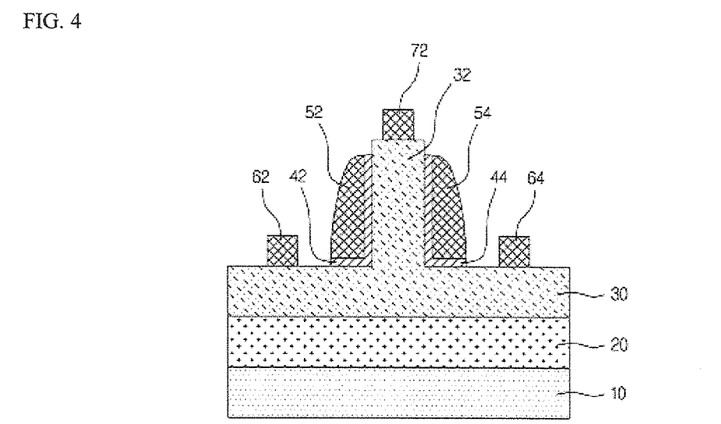
FIG. 4 is a cross-sectional view showing a structure of a compound junctionless field effect transistor having a vertical channel according to another embodiment of the present invention.

Therefore, the compound junctionless field effect transistor according to the present invention is differed from the prior junctionless field effect transistor fabricated on an SOI substrate (referred to FIG. 2) and can overcome all problems of the prior junctionless field effect transistor by optimally forming hetero-semiconductor layers 20 and 30 on the bulk silicon substrate 10 (referred to FIG. 3 and FIG. 4).

Hereafter, more detailed descriptions of preferred embodiments to implement the technical idea of a compound junctionless field effect transistor according to the present invention are provided with respect to FIGS. 3 and 4.

A compound junctionless field effect transistor according to one embodiment of the present invention comprises, as shown in FIG. 3, a bulk silicon substrate 10; a blocking semiconductor layer 20 formed of a first semiconductor material having a lattice constant difference with silicon 5% or less and doped to have a first conductive type (e.g., p-type) on the silicon substrate 10; an active layer 30 formed of a second semiconductor material having a lattice constant difference with the first semiconductor material 2% or less, an electron affinity difference with the first semiconductor material 0.1 eV or less, an energy bandgap 0.5 eV larger than that of the first semiconductor material and doped to have a second conductive type (e.g., n-type) opposite to the first conductive type on the blocking semiconductor layer 20; a gate electrode 50 formed to be separated by a gate dielectric layer 40 on the active layer 30; and source and drain electrodes 60 and 70 formed to contact electrically to the active layer 30 with having a specific interval from each other and being separated by the gate electrode 50.

Here, since the blocking semiconductor layer 20 must be grown epitaxially on the bulk silicon layer 10 to form an energy barrier against the active layer 30, it is formed by a first semiconductor material having a lattice constant difference with silicon 5% or less, wherein the first semiconductor material is selected to have it the first conductive type (e.g., p-type) opposite to the active layer 30 and the different physical properties to the active layer 30.

If the first semiconductor material has a lattice constant difference with the silicon substrate 10 larger than 5%, it is difficult to epitaxially grow the first semiconductor material directly on the silicon substrate 10. Thus, in that case, it needs a plurality of buffer layers to form the first semiconductor material on the silicon substrate 10.

And, since the active layer 30 has to be thinly epitaxially grown on the blocking semiconductor layer 20, it is preferable to be formed by a second semiconductor material having a lattice constant difference with the first semiconductor material 2% or less. If the active layer 30 has a lattice constant difference with the first semiconductor material larger than 2%, it is difficult to uniformly grow the second semiconductor material having a thin thickness due to the lattice mismatch on the junction interface.

On the other hand, since the energy barrier has to be formed on the junction interface by seeing from the blocking semiconductor layer 20, the active layer 30 is preferable to be formed by the second semiconductor material having the electron affinity difference with the first semiconductor material 0.1 eV or less and the energy bandgap 0.5 eV larger than that of the first semiconductor material.

If the electron affinity difference between the first and second semiconductor materials is over 0.1 eV, though the difference of energy bandgap is larger than 0.5 eV, it is difficult to form the energy barrier for blocking the movement of the majority carriers of the blocking semiconductor layer 20 to the active layer 30 at the off-operation time of device.

Therefore, it is preferable to select the first and second semiconductor materials having electron affinity difference with each other nearly the same as 0.1 eV or less and the second semiconductor material having energy bandgap 0.5 eV larger than that of the first semiconductor material. By the above requirement, when the majority carriers of the blocking semiconductor layer 20 look at the active layer 30 at the off-operation time of device, they can experience an energy barrier as high as the difference of energy bandgaps of both. As a result, the leakage current is blocked by the energy barrier at the off-operation time.

Here, if the energy bandgap of the second semiconductor material is not 0.5 eV larger than that of the first semiconductor material, the energy barrier experienced when the majority carriers of the blocking semiconductor layer 20 look at the active layer 30 at the off-operation time of device is low. There is a problem that the movement of the majority carriers of the blocking semiconductor layer 20 to the active layer 30 cannot be effectively blocked.

And, the blocking of the leakage current at the off-operation time is reinforced by the pn junction of the blocking semiconductor 20 and the active layer 30 having the different conductive type each other.

At this time, an n-channel device or a p-channel device, similarly with general MOSFET, can be implemented according to the second conductive type of the active layer 30.

In the blocking semiconductor 20 and the active layer 30, the doping concentration of dopant to have each conductive type is optimally determined by considering the device operation properties. Especially, it must be determined to minimize the leakage current problem due to the minority carriers of the blocking semiconductor layer 20 tunneling to the active layer 30 at the on-operation time.

For this, the active layer 30 is preferable to have majority carriers of the second semiconductor material be in degenerate states, but not to flat the energy band by exceeding degenerate for making the energy band be sloped at the device operation time, specifically at the on-operation time for restraining the tunneling of the minority carriers of the blocking semiconductor layer 20 to the active layer 30.

On the other hand, the blocking semiconductor layer 20 can get the majority carriers of the first semiconductor material to be in non-degenerate states by controlling doping concentration of the dopant to have the first conductive type.

For a detailed embodiment satisfied with above requirement, the active layer 30 is doped with an n-type dopant to have Fermi level be formed at 3 kT (about 78 meV at room temperature 300K) or less energies over the minimum value of conduction band of the second semiconductor material at an absolute temperature T, and the blocking semiconductor layer 20 is doped with a p-type dopant to have Fermi level be formed at 3 kT or higher energies over the maximum value of valance band of the first semiconductor material at an absolute temperature T.

Namely, in an n-channel device having the active layer 30 doped with an n-type dopant, the active layer 30 is doped with an n-type dopant for Fermi level being at the energies above the minimum value of conduction band of the second semiconductor material in order to electrons as the majority carriers to be in degenerate states, but is not exceedingly doped with doping concentration as high as Fermi level being at 3 kT greater energies over the minimum value of conduction band of the second semiconductor material. Thus, it is preferable that the active layer 30 is doped with the specific doping concentration meeting the above requirement to keep the band slope of the active layer 30 at the device operation time.

Here, if Fermi level is at 3 kT greater energies over the minimum value of the conduction band of the second semiconductor material by doping the active layer 30 with high concentration of the n-type dopant, there are not only one problem due to the high concentration of dopant such as the prior problem, but also another problem of the leakage current due to the interband tunneling caused by the minimized thick of energy band when electrons as the minority carriers of the blocking semiconductor layer 20 look at the active layer 30 at the on-operation time because of the energy band of the active layer 30 becoming flat.

However, if Fermi level is at the energy smaller than the minimum value of the conduction band of the second semiconductor material by reducing the n-type dopant concentration of the active layer 30, the electrons as the majority carriers are in non-degenerate states. In this case, it is a problem that the operation is difficult in the junctionless device operated by the majority carriers of the active layer 30, but not by the injected electrons from the source region as shown in FIG. 1.

And, since it is preferable that the depletion region formed at the pn junction interface of the both layers is widen toward the blocking semiconductor layer 20, the p-type dopant concentration of the blocking semiconductor layer 20 is preferable to form Fermi level at 3 kT greater energies over the maximum value of valance band of the first semiconductor material at an absolute temperature T.

Here, Fermi level formed at 3 kT or higher energies over the maximum value of valance band of the first semiconductor material at absolute temperature T means that the p-type dopant concentration can be lowered to Fermi level being in the intrinsic state of the first semiconductor material not doped with any dopant.

In the blocking semiconductor layer 20, if the p-type dopant concentration is high to form Fermi level at 3 kT smaller energies over the maximum value of valance band of the first semiconductor material, the width of the depletion region in the block semiconductor layer 20 is relatively narrowed and the valance band of the first semiconductor material in the depletion region is steeply sloped. As a result, the width of energy band seen by the electrons as the minority carriers of the blocking semiconductor layer 20 to the active layer 30 at the on-operation time becomes small and it causes a problem of leakage current by the interband tunneling.

For more detailed embodiment, the n-type dopant concentration of the active layer 30 can be $9 \times 10^{16} \sim 1 \times 10^{18}/cm^3$ and the p-type dopant concentration of the blocking semiconductor layer 20 can be $3.4 \times 10^{17}/cm^3$ or lower.

Figure 5:
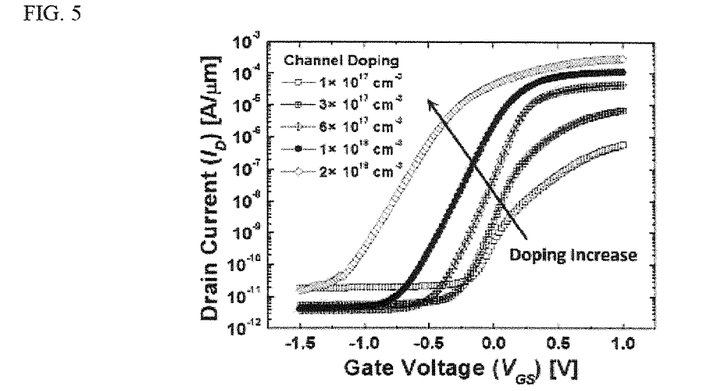
FIG. 5 is an electrical characteristic view showing changes of current-voltage curves according to a channel doping of an active layer in a compound junctionless field effect transistor according to the present invention.

FIG. 5 is an electrical characteristic view showing changes of current-voltage curves according to a channel doping of an active layer 30 in a compound junctionless field effect transistor of the present invention. The value of driving current is increased with the increase of the dopant concentration of a channel, but there is a problem that the leakage current is also increased at the off-operation time.

And, since the second semiconductor material is a material having electron or hole mobility higher than that of the silicon, there are advantages that direct-current (DC) and high-frequency characteristic properties are excellent and the low power operation is possible.

For being satisfied with the above requirement of the described embodiments, the first and second semiconductor materials can be variously selected. But it is preferable that the first semiconductor material is germanium (GE) or silicon germanium (Si1−xGex) and the second semiconductor material is gallium arsenide (GaAs).

Namely, since the lattice constants of silicon substrate and germanium (Ge) are 5.43 Å and 5.65 Å, respectively, the difference of the lattice constants is within 5%. Silicon germanium ($Si_{1-x}Ge_x$, x is a mole ratio, 0<x<1) is grown by adding germanium to silicon. And it is satisfied with the requirement of lattice constant.

And, the requirement of junction between the blocking semiconductor layer 20 and the active layer 30 is also satisfied as follows: the lattice constant value of gallium arsenide (GaAs) is equal to that of germanium (Ge), the electron affinities of germanium (Ge) and gallium arsenide (GaAs) are nearly equal to each other, as 4.13 eV and 4.07 eV, respectively, the energy bandgaps of germanium (Ge) and gallium arsenide (GaAs) are 0.66 eV and 1.42 eV, respectively, and the difference of the energy bandgap is 0.76 eV. Thus, the materials can be selected as compositions for blocking the leakage current in the junctionless device.

Especially, if the second semiconductor material is gallium arsenide (GaAs) in the re-channel device having the active layer 30 doped with n-type dopant, the objective of the present invention can be sufficiently achieved because the electron mobility of gallium arsenide is $8500V \cdot s/cm^2$, i.e., 6 times higher than $1350 V \cdot s/cm^2$ of silicon.

And, if the active layer 30 is formed as an n-type gallium arsenide (GaAs) and Fermi level is at 3 kT energy over the minimum value of the conduction band of the second semiconductor material at an absolute temperature T, the n-type dopant concentration is $9 \times 10^{16}/cm^3$. Also, if the blocking semiconductor layer 20 is formed as a p-type germanium (Ge) and Fermi level is at 3 kT energy over the maximum value of the valance band of the first semiconductor material at an absolute temperature T, the p-type dopant concentration is $3.4 \times 10^{17}/cm^3$.

Figure 6:
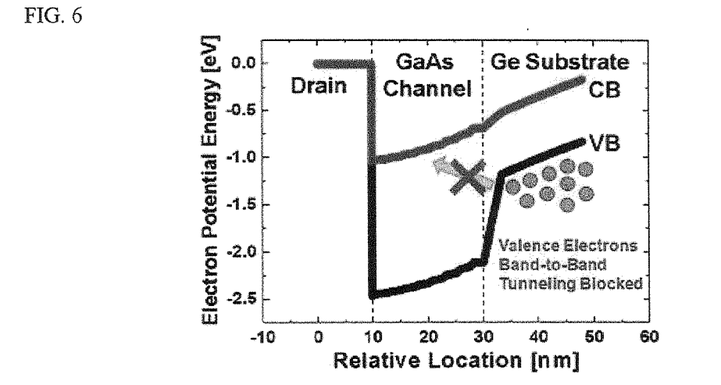
FIG. 6 is a band diagram showing energy band structures at ON operation time under the drain electrode of a compound junctionless field effect transistor according to the present invention.

FIG. 6 is a band diagram showing energy band structures under the drain electrode 70 of a detailed n-channel compound junctionless field effect transistor having the active layer 30 and the blocking semiconductor layer 20 formed as an n-type gallium arsenide (GaAs) and a p-type germanium (Ge), respectively, at the on-operation time.

In an on state, electrons as the minority carriers in the blocking semiconductor layer 20 are bounded in valance band. When the positive voltage is applied to the drain electrode 70, the electrons can be moved up from the substrate to gallium arsenide (GaAs) of the active layer 30 only by the interband tunneling, causing the leakage current. But in this embodiment, the leakage current of an on state is effectively blocked by the following points: firstly the interband tunneling is suppressed by large energy bandgap of gallium arsenide (GaAs), secondly the size of the width between the valance band (VB) of germanium (Ge) and the conduction band (CB) of gallium arsenide (GaAs) is much more increased by the energy band slope of gallium arsenide (GaAs), and finally the probability of the interband tunneling is more decreased according to the size of the interband width.

Figure 7:
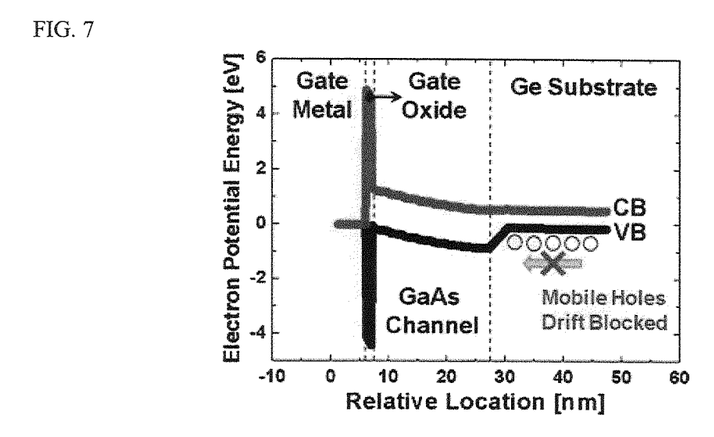
FIG. 7 is a band diagram showing energy band structures in an off state or negative voltage applied to a gate electrode of a compound junctionless field effect transistor according to the present invention.

FIG. 7 is a band diagram showing energy band structures under the drain electrode 70 of an n-channel compound junctionless field effect transistor consisted of as shown in FIG. 6 when a negative voltage is applied to a gate electrode at the off-operation time.

In an off state, holes as the majority carriers of the blocking semiconductor layer 20 are collected in the upper part of valance band. When a negative voltage is applied to the gate electrode 50, the holes are moved to gallium arsenide (GaAs) of the active layer 30 inducing the leakage current of an off state. When the holes in the upper part of valance band (VB) of germanium (Ge) look at gallium arsenide (GaAs) of the active layer 30, they experience an energy barrier formed in the valance band of gallium arsenide (GaAs) with height as high as the difference of energy bandgaps between the both. Thus, the leakage current of an on state is efficiently repressed because the holes of the blocking semiconductor layer 20 cannot move to the active layer 30.

The embodiments of the planar-type compound junctionless field effect transistors, as shown in FIG. 3, are explained, but it is not restricted.

Namely, as shown in FIG. 4, other embodiment of the present invention can be implemented as a compound junctionless field effect transistor having a vertical channel.

Moreover, the compound junctionless field effect transistor having a vertical channel according to the present invention is not only restricted to the structure as shown in FIG. 4, but also can be variously implemented.

The compound junctionless field effect transistors having a vertical channel can, from the planar-type embodiments, be formed to have a vertical channel structures 32 by the following sequential processes: projecting the active layer 30 from the blocking semiconductor layer 20 to form one sidewall at least and forming sequentially the gate dielectric layer 40 and the gate electrode 50 on the sidewalls to form sidewall gate dielectric layers 42 and 44 and sidewall gate electrodes 52 and 54, respectively.

Here, the compound junctionless field effect transistors having a vertical channel can be implemented with various vertical channel structures depending on the shape of a projected active layer 32. It can be listed such as a junctionless device having one sidewall of mesa structure as a vertical channel, a junctionless device having a fin structure of a FinFET type or a double gate type and a junctionless device having a gate-all-around type wrapping a vertical pillar with a gate electrode and the like.

Among the gate-all-around typed junctionless devices, in the planar-type embodiments, the active layer 30 is projected to a cylindrical column shape 32 from the blocking semiconductor layer 20 and the gate dielectric layer 40 and the gate electrode 50 are formed to wrap around the cylindrical column 32 to have a cross-sectional structure as shown in FIG. 4.

In this case, the reference numbers 42 and 44 in FIG. 4 mean one gate dielectric layer, 52 and 54 one gate electrode, 62 and 64 one source electrode (or one drain electrode), and 72 one drain electrode (or one source electrode).

Since the each embodiment of the compound junctionless field effect transistors having a vertical channel is formed to locate any one 72 of the source and drain electrodes at far from the blocking semiconductor layer 20, there is an advantage that the problem of leakage current at an on/off operation time be solved more easily than the planar-type junctionless device.

The other description of each embodiment of the compound junctionless field effect transistors having a vertical channel can refer to the description of the planar-type embodiments.

This invention was supported by the Center for Integrated Smart Sensors funded by the Korean Ministry of Education, Science and Technology as Global Frontier Project (CISS-2011-0031845) executing from Sep. 29, 2011 to Aug. 31, 2020 for "Innovative Nanodevices Technology Development".

What is claimed is:

1. A compound junctionless field effect transistor comprising:
   a bulk silicon substrate not having a buried oxide layer;
   a blocking semiconductor layer formed of a first semiconductor material having a lattice constant difference with silicon 5% or less and doped to have a first conductive type on the silicon substrate;
   an active layer formed of a second semiconductor material having a lattice constant difference with the first semiconductor material 2% or less, an electron affinity difference with the first semiconductor material 0.1 eV or less, and an energy bandgap 0.5 eV greater than that of the first semiconductor material and doped to have a second conductive type opposite to the first conductive type on the blocking semiconductor layer;
   a gate electrode formed to be separated by a gate dielectric layer on the active layer; and
   source and drain electrodes formed to contact electrically to the active layer with having a specific interval from each other and being separated by the gate electrode,
   wherein a first heterojunction is formed between the bulk silicon substrate and the blocking semiconductor layer and a second heterojunction is formed between the blocking semiconductor layer and the active layer.

2. The compound junctionless field effect transistor of claim 1, wherein the second semiconductor material has electron or hole mobility higher than that of the silicon.

3. The compound junctionless field effect transistor of claim 2, wherein:
   the active layer is projected to have one sidewall at least on the blocking semiconductor layer, and
   the gate dielectric layer and the gate electrode are formed on the sidewall to have a vertical channel structure.

4. The compound junctionless field effect transistor of claim 3, wherein:
   the active layer is projected to have a cylindrical column shaped sidewall on the blocking semiconductor layer, and
   the gate dielectric layer and the gate electrode are formed to wrap the cylindrical column shaped sidewall.

5. The compound junctionless field effect transistor of claim 1, wherein:
   the active layer is doped with doping concentration to have majority carriers of the second semiconductor material be in degenerate states but to make an energy band be sloped at an operation time, and
   the blocking semiconductor layer is doped with doping concentration to have majority carriers of the first semiconductor material be in non-degenerate states.

6. The compound junctionless field effect transistor of claim 5, wherein:
   the active layer is doped with an n-type dopant to have Fermi level be formed within 3 kT over the minimum value of conduction band of the second semiconductor material at an absolute temperature T, and
   the blocking semiconductor layer is doped with a p-type dopant to have Fermi level be formed at 3 kT or higher energies over the maximum value of valance band of the first semiconductor material at an absolute temperature T.

7. The compound junctionless field effect transistor of claim 5, wherein:
   the active layer is doped to have the second conductive type be an n-type and to have the doping concentration of the n-type dopant be $9\times10^{16} \sim 1\times10^{18}/cm^3$, and
   the blocking semiconductor layer is doped to have the first conductive type be a p-type and to have the doping concentration of the p-type dopant be $3.4\times10^{17}/cm^3$ or lower.

8. The compound junctionless field effect transistor of claim 5, wherein:
   the first semiconductor material is germanium (Ge) or silicon germanium ($Si_{1-x}Ge_x$), and
   the second semiconductor material is gallium arsenide (GaAs).

9. The compound junctionless field effect transistor of claim 2, wherein:
   the active layer is doped with doping concentration to have majority carriers of the second semiconductor material be in degenerate states but to make an energy band be sloped at an operation time, and
   the blocking semiconductor layer is doped with doping concentration to have majority carriers of the first semiconductor material be in non-degenerate states.

10. The compound junctionless field effect transistor of claim 9, wherein:
    the active layer is doped with an n-type dopant to have Fermi level be formed within 3 kT over the minimum value of conduction band of the second semiconductor material at an absolute temperature T, and
    the blocking semiconductor layer is doped with a p-type dopant to have Fermi level be formed at 3 kT or higher energies over the maximum value of valance band of the first semiconductor material at an absolute temperature T.

11. The compound junctionless field effect transistor of claim 9, wherein:
    the active layer is doped to have the second conductive type be an n-type and to have the doping concentration of the n-type dopant be $9\times10^{16} \sim 1\times10^{18}/cm^3$, and
    the blocking semiconductor layer is doped to have the first conductive type be a p-type and to have the doping concentration of the p-type dopant be $3.4\times10^{17}/cm^3$ or lower.

12. The compound junctionless field effect transistor of claim 9, wherein:
    the first semiconductor material is germanium (Ge) or silicon germanium ($Si_{1-x}Ge_x$), and
    the second semiconductor material is gallium arsenide (GaAs).

13. The compound junctionless field effect transistor of claim 3, wherein:
the active layer is doped with doping concentration to have majority carriers of the second semiconductor material be in degenerate states but to make an energy band be sloped at an operation time, and
the blocking semiconductor layer is doped with doping concentration to have majority carriers of the first semiconductor material be in non-degenerate states.

14. The compound junctionless field effect transistor of claim 13, wherein:
the active layer is doped with an n-type dopant to have Fermi level be formed within 3 kT over the minimum value of conduction band of the second semiconductor material at an absolute temperature T, and
the blocking semiconductor layer is doped with a p-type dopant to have Fermi level be formed at 3 kT or higher energies over the maximum value of valance band of the first semiconductor material at an absolute temperature T.

15. The compound junctionless field effect transistor of claim 13, wherein:
the active layer is doped to have the second conductive type be an n-type and to have the doping concentration of the n-type dopant be $9 \times 10^{16} \sim 1 \times 10^{18}/cm^3$, and
the blocking semiconductor layer is doped to have the first conductive type be a p-type and to have the doping concentration of the p-type dopant be $3.4 \times 10^{17}/cm^3$ or lower.

16. The compound junctionless field effect transistor of claim 13, wherein:
the first semiconductor material is germanium (Ge) or silicon germanium ($Si_{1-x}Ge_x$), and
the second semiconductor material is gallium arsenide (GaAs).

17. The compound junctionless field effect transistor of claim 4, wherein:
the active layer is doped with doping concentration to have majority carriers of the second semiconductor material be in degenerate states but to make an energy band be sloped at an operation time, and
the blocking semiconductor layer is doped with doping concentration to have majority carriers of the first semiconductor material be in non-degenerate states.

18. The compound junctionless field effect transistor of claim 17, wherein:
the active layer is doped with an n-type dopant to have Fermi level be formed within 3 kT over the minimum value of conduction band of the second semiconductor material at an absolute temperature T, and
the blocking semiconductor layer is doped with a p-type dopant to have Fermi level be formed at 3 kT or higher energies over the maximum value of valance band of the first semiconductor material at an absolute temperature T.

19. The compound junctionless field effect transistor of claim 17, wherein:
the active layer is doped to have the second conductive type be an n-type and to have the doping concentration of the n-type dopant be $9 \times 10^{16} \sim 1 \times 10^{18}/cm^3$, and
the blocking semiconductor layer is doped to have the first conductive type be a p-type and to have the doping concentration of the p-type dopant be $3.4 \times 10^{17}/cm^3$ or lower.

20. The compound junctionless field effect transistor of claim 17, wherein:
the first semiconductor material is germanium (Ge) or silicon germanium ($Si_{1-x}Ge_x$), and
the second semiconductor material is gallium arsenide (GaAs).

* * * * *